(12) United States Patent
Ban et al.

(10) Patent No.: US 6,696,849 B2
(45) Date of Patent: Feb. 24, 2004

(54) FABRICATION METHOD OF SEMICONDUCTOR INTEGRATED CIRCUIT DEVICE AND ITS TESTING APPARATUS

(75) Inventors: Naoto Ban, Sagamihara (JP); Masaaki Namba, Sayama (JP); Akio Hasebe, Higashimurayama (JP); Yuji Wada, Tachikawa (JP); Ryuji Kohno, Chiyoda (JP); Akira Seito, Akishima (JP); Yasuhiro Motoyama, Kodaira (JP)

(73) Assignee: Renesas Technology Corporation, Tokyo (JP)

( * ) Notice: Subject to any disclaimer, the term of this patent is extended or adjusted under 35 U.S.C. 154(b) by 62 days.

(21) Appl. No.: 09/964,708

(22) Filed: Sep. 28, 2001

(65) Prior Publication Data

US 2002/0039802 A1 Apr. 4, 2002

(30) Foreign Application Priority Data

Oct. 3, 2000 (JP) ........................................ 2000-304099

(51) Int. Cl.[7] .......................... G01R 31/02; H01L 21/66
(52) U.S. Cl. .......................... 324/760; 324/754; 438/17
(58) Field of Search ................................ 324/760, 754, 324/758, 765; 438/14, 17

(56) References Cited

U.S. PATENT DOCUMENTS 5,070,297 A * 12/1991 Kwon et al. ................. 324/754
5,701,666 A * 12/1997 DeHaven et al. ............ 324/754
5,945,834 A * 8/1999 Nakata et al. ............... 324/754
6,275,051 B1 * 8/2001 Bachelder et al. .......... 324/754

FOREIGN PATENT DOCUMENTS

| JP | 9-148389 | 6/1997 |
|---|---|---|
| JP | 11-97494 | 4/1999 |

* cited by examiner

Primary Examiner—Ernest Karlsen
(74) Attorney, Agent, or Firm—Antonelli, Terry, Stout & Kraus, LLP (57) ABSTRACT

A testing apparatus and a fabricating method of a semiconductor integrated circuit device for reducing the fabrication cost by placing, in the wafer level burn-in, divided contactors in equally contact with the full surface of wafer, enabling repair of each contactor and improving the yield of contactors. The cassette structure of the mechanical pressurizing system in the testing apparatus is structured with a plurality of divided silicon contactor blocks and a guide frame for integrating these blocks and employs the wafer full surface simultaneous contact system of the divided contactor integration type. Each probe of the silicon contactor is equally placed in contact in the predetermined pressure with each test pad of each chip of the test wafer by mechanically pressuring each silicon contactor block which moves individually, the test control signal is supplied to each chip and this test result signal is obtained for the wafer level burn-in test.

6 Claims, 9 Drawing Sheets

FABRICATION METHOD OF SEMICONDUCTOR INTEGRATED CIRCUIT DEVICE AND ITS TESTING APPARATUS

BACKGROUND OF THE INVENTION

The present invention relates to a technique for fabricating a semiconductor integrated circuit device and a testing apparatus therefor; and, more specifically, the invention relates to a technique that can be applied, for example, to a burn-in test and probe test of a semiconductor integrated circuit device, and effectively can be applied particularly to a burn-in test of a semiconductor device in the wafer condition, that is, to a so-called wafer level burn-in test.

The present invention relates to a test technique and a fabrication technique applicable to a semiconductor integrated circuit device. According to investigations carried out by the inventors of the present invention regarding burn-in test techniques, for example, the official gazette of the Japanese Laid-Open Patent Applications Nos. HEI 11(1999)-97494, 9(1997)-148389 and "NIKKEI MICRO-DEVICE", January 2000, pages 148 to 153 have been found to be relevant.

The official gazette of Japanese Laid-Open Patent Application No. HEI 11(1999)-97494 discloses a technique used to equalize the pushing pressure during testing by dividing the pushing member in order to share the pushing load between a plurality of places on the plane on the opposite side of the wafer relative to the pushing member when a plurality of probes provided on a membrane are pushed toward the wafer using the pushing member in the burn-in test of the wafer.

The official gazette of Japanese Laid-Open Patent Application No. HEI 9(1997)-148389 discloses a technique that uses a beam that maintains it elasticity toward the upper and lower directions on a silicon substrate with a micro-machining technique and also employs a micro-contact pin at an end of this beam in the layout provided at a position opposed to the electrode of a wafer, with a conductive thin film process being executed at the end of such micro-contact pin.

The reference "Nikkei MICRO-DEVICE, January, 2000" describes a system using a TPS (Three Parts Structure) probe, consisting of three parts including a multilayer wiring board, a thin film sheet with a bump and an anisotropic conductive rubber member, and a system in which a multilayer wiring board and a probe terminal are provided, the probe terminal having a structure in which a copper post is provided through a resin sheet, so that when pressure is applied, this copper post is crushed, whereby an unequal height of electrodes is equalized.

SUMMARY OF THE INVENTION

The inventors of the present invention have considered the technique used in the burn-in test as explained above and have established following conclusions.

For example, available semiconductor integrated circuit device test techniques include a burn-in test for screening a chip that may change to a defective chip when subjected to temperature and voltage stresses under a higher temperature atmosphere, a function test to check whether a device operates as specified for a predetermined function, and a probe test for determining good/no-good products by executing a test to determine the DC operation characteristic and AC operation characteristic thereof.

In recent years, in the burn-in test of a semiconductor integrated circuit device, the wafer level burn-in technique used to conduct a burn-in test in the wafer condition has been based on the requirement for coverage of wafer delivery (discrimination of quality) and KGD (Known Good Die)(improvement of yield of MCP (Multi-Chip Package)) and for relief of a no-good product for burn-in, feed-back of test data of a no-good product for burn-in and reduction of total cost or the like.

In this wafer level burn-in process, it is essential to solve certain technical problems, such as provision of a pushing mechanism that is able to realize equal pressurizing of the entire surface of a wafer, the provision of a wafer heating and temperature control mechanism, the requirement for a probe of ten thousand or more pins for covering the entire surface of the wafer, the need for absorption of warp and wave of the wafer surface and unequal heights of the probe, the dependence on the thermal expansion coefficient under higher temperature conditions, the layout of many wires, the necessity for gathering of input signals, the requirement for probe alignment to the entire surface of the wafer, the disconnection of a defective chip and cut-off of an overcurrent, and a contact check for the entire surface of wafer.

In regard to the burn-in test, to solve such technical problems, there has been proposed, for example, a technique described in the "NIKKEI MICRO-DEVICE, January, 2000". However, this technique is assumed to include various problems, in that a film forming apparatus to eliminate a defective chip is required in the system utilizing the TPS probe described in the above publication, the wafer level burn-in may be executed only in the last stage of a probe test and laser relief, the contact resistance of a thin film sheet with a bump may be increased easily depending on the number of times of contact, a partial repair is impossible in the integrated structure, and the operation life of anisotropic conductive rubber is rather short.

Moreover, in the system utilizing the technique including the multilayer wiring board and probe terminal described in "NIKKEI MICRO-DEVICE, January, 2000", there is assumed to be a problem in that a resin sheet is used only for a gold pad and this sheet is thrown away after it is once used.

It is an object of the present invention to provide a method of fabricating a semiconductor integrated circuit device and a method of testing the same device for realizing reduction in cost by employing a divided contactor integrating system, for example, in the burn-in test and probe test, particularly in wafer level burn-in, thereby realizing uniform contact of the divided contactors on the entire surface of the wafer, thereby enabling individual repair for each divided contactor and reducing the manufacturing cost through improvement of the yield of divided contactors.

The above and the other objects and novel features of the present invention will become apparent from the following description and the accompanying drawings.

The typical aspects of the invention among those disclosed in this specification will be briefly explained below.

(1) A testing apparatus of a semiconductor integrated circuit device comprises the following structural elements:
   (a) a plurality of test styluses used to conduct an electric test in contact with a plurality of terminals provided on the first main plane of a wafer on which a plurality of semiconductor integrated circuit devices are formed;
   (b) a single layer or multiple layers of the first wiring layer connected to a plurality of the test styluses; and
   (c) a plurality of wiring/stylus composite plates wherein a plurality of the test styluses are held in a manner such that each tip thereof is projected toward the first main plane side and the first wiring layer is included respectively in each plate.

(2) In the testing apparatus of the semiconductor integrated circuit device of item (1), each plate of a plurality of wiring/stylus composite plates allocates test styluses to measure a plurality of chip regions formed on the first main plane of the wafer.

(3) In the testing apparatus of the semiconductor integrated circuit device of item (2), a plurality of terminals of the first chip region in a plurality of chip regions formed on the first main plane of the wafer are allocated to measure in contact with both test styluses of the first and second wiring/stylus composite plates among a plurality of wiring/stylus composite plates.

(4) In the testing apparatus of the semiconductor integrated circuit device of item (3), the number of wiring/stylus composite plates is 4 or more.

(5) In the testing apparatus of the semiconductor integrated circuit device of item (3), the number of wiring/stylus composite plates is 9 or more.

(6) In the testing apparatus of the semiconductor integrated circuit device of item (5), the number of chip regions to be measured with each plate among a plurality of wiring/stylus composite plates is 9 or more.

(7) In the testing apparatus of the semiconductor integrated circuit device of item (5), the number of chip regions to be measured with each plate among a plurality of wiring/stylus composite plates is 16 or more.

(8) In the testing apparatus of the semiconductor integrated circuit device of item (7), a plurality of the wiring/stylus composite plates includes a plate member mainly composed of silicon as the main structural element.

(9) In the testing apparatus of the semiconductor integrated circuit device of item (8), the wafer includes a plate member mainly composed of silicon as the main structural element.

(10) In the testing apparatus of the semiconductor integrated circuit device of item (9), the electric test is a burn-in test.

(11) A method of fabricating a semiconductor integrated circuit device comprising the steps of:
  (a) preparing for a plurality of test styluses used to conduct electric test in contact with a plurality of terminals provided on the first main plane of wafer on which a plurality of semiconductor integrated circuit devices are formed, a single layer or multiple layers of the first wiring layer connected to a plurality of the test styluses, and a plurality of wiring/stylus composite plates wherein a plurality of the test styluses are held in a manner such that each end point thereof is projected toward the first main plane side and the first wiring layer is included respectively in each plate; and
  (b) conducting an electric test of a plurality of chip regions with a plurality of test styluses of each plate among a plurality of wiring/stylus composite plates in contact with a plurality of terminals of the plurality of chip regions formed on the first main plane of the wafer.

(12) In the method of fabricating the semiconductor integrated circuit device of item (11), the electric test is a burn-in test.

(13) A method of fabricating a semiconductor integrated circuit device comprising the steps of:
  (a) preparing for a plurality of test styluses used to conduct electric test in contact with a plurality of terminals provided on the first main plane of wafer on which a plurality of semiconductor integrated circuit devices are formed, a single layer or multiple layers of the first wiring layer connected to a plurality of the test styluses, and a plurality of wiring/stylus composite plates wherein a plurality of the test styluses are held in a manner such that each end point thereof is projected toward the first main plane side and the first wiring layer is included respectively in each plate; and
  (b) conducting an electric test by bringing a plurality of styluses of both first and second wiring/stylus composite plates among a plurality of wiring/stylus composite plates into contact with a plurality of terminals of the first chip region among a plurality of chip regions formed on the first main plane of the wafer.

(14) In the method of fabricating the semiconductor integrated circuit device of item (13), the electric test is a burn-in test.

(15) A method of fabricating a semiconductor integrated circuit device comprising the steps of:
  (a) preparing for a plurality of test styluses used to conduct electric test in contact with a plurality of terminals provided on the first main plane of wafer on which a plurality of semiconductor integrated circuit devices are formed, a single layer or multiple layers of the first wiring layer connected to a plurality of the test styluses, and a plurality of wiring/stylus composite plates wherein a plurality of the test styluses are held in a manner such that each end point thereof is projected toward the first main plane side and the first wiring layer is included respectively in each plate; and
  (b) conducting an electric test for a plurality of chip regions by bringing a plurality of test styluses of each plate among a plurality of wiring/stylus composite plates into contact with a plurality of terminals of a plurality of chip regions including a BIST circuit formed on the first main plane of the wafer.

(16) In the method of fabricating the semiconductor integrated circuit device in item (15), the electric test is a burn-in test.

(17) A method of fabricating a semiconductor integrated circuit device comprising the steps of:
  (a) preparing for a plurality of test styluses used to conduct electric test in contact with a plurality of terminals provided on the first main plane of wafer on which a plurality of semiconductor integrated circuit devices are formed, a single layer or multiple layers of the first wiring layer connected to a plurality of the test styluses, and a plurality of wiring/stylus composite plates wherein a plurality of the test styluses are held in a manner such that each end point thereof is projected toward the first main plane side and the first wiring layer is included respectively in each plate; and
  (b) conducting an electric test for a plurality of chip regions by bringing a plurality of test styluses of each plate among a plurality of wiring/stylus composite plates into contact, under a vacuum or evacuated condition, with a plurality of terminals of a plurality of chip regions formed on the first main plane of the wafer.

(18) In the method of fabricating the semiconductor integrated circuit device of item (17), the electric test is the burn-in test.

(19) There is provided a wiring/stylus composite plate on which a plurality of test styluses are provided and the plate is divided into a plurality of regions for a sheet of test wafer.

(20) In the testing apparatus of the semiconductor integrated circuit device of item (19), guide frames are provided to integrate the divided wiring/stylus composite plate and the wiring/stylus composite plate integrated with one guide frame forms an integrated contactor on the entire surface of one wafer corresponding to a sheet of test wafer (hereinafter referred to as a test wafer).

(21) In the testing apparatus of the semiconductor integrated circuit device of item (20), the divided wiring/stylus composite plate is formed of a material having the same thermal expansion coefficient as that of the test wafer.

(22) In the testing apparatus of the semiconductor integrated circuit device of item (21), the test wafer is formed of a silicon substrate and the divided wiring/stylus composite plate is composed of a silicon substrate.

(23) In the testing apparatus of the semiconductor integrated circuit device of item (21), the test wafer is formed of a silicon substrate and the divided wiring/stylus composite plate is formed of a silicon membrane sheet.

(24) In the testing apparatus of the semiconductor integrated circuit device of item (20), the guide frame is formed of a material having a thermal expansion coefficient that is approximated to that of the test wafer.

(25) In the testing apparatus of the semiconductor integrated circuit device of item (24), the test wafer is formed of a silicon substrate and the guide frame is formed of 42 alloy or nickel alloy.

(26) In the testing apparatus of the semiconductor integrated circuit device of item (20), a plurality of probes of the divided wiring/stylus composite plate are respectively formed in a pyramidal shape with a micro-machining technique, such as an anisotropic etching process.

(27) In the testing apparatus of the semiconductor integrated circuit device of item (26), the probes of the wiring/stylus composite plate may respectively be deformed at the periphery thereof with pressure.

(28) In the testing apparatus of the semiconductor integrated circuit device of item (27), the periphery of each probe of the wiring/stylus composite plate may be deformed with a mechanical pressurizing system and the probe is brought into electrical contact, under the deformed condition, with each test pad of each chip of the test wafer with a predetermined pressure.

(29) In the testing apparatus of the semiconductor integrated circuit device of item (27), the periphery of each probe of the wiring/stylus composite plate may be deformed with a vacuum or evacuation pressurizing system and each probe is electrically brought into contact, in the deformed condition, with each testing pad of the test wafer.

(30) In the testing apparatus of the semiconductor integrated circuit device of item (20), the divided areas of the divided wiring/stylus composite plate are deviated in the position from the scribe area of each chip of the test wafer.

(31) In the testing apparatus of the semiconductor integrated circuit device of item (20), the respective plates of the divided wiring/stylus composite plate correspond to a plurality of chip units of the test wafer.

(32) In the testing apparatus of the semiconductor integrated circuit device of item (20), the respective plates of the divided wiring/stylus composite plate may be repaired individually.

(33) In the testing apparatus of the semiconductor integrated circuit device of item (20), the divided wiring/stylus composite plates respectively have positioning marks.

(34) In the testing apparatus of the semiconductor integrated circuit device of item (20), the respective chips of the test wafer have a BIST circuit.

(35) In the testing apparatus of the semiconductor integrated circuit device of item (34), a plurality of testing pads on the chip hold the other pads and are allocated separately in the periphery.

(36) In the testing apparatus of the semiconductor integrated circuit device of item (19), there are comprised a plurality of divided wiring/stylus composite plates, a guide frame for integrating the divided wiring/stylus composite plates, a multilayer wiring substrate electrically connected to the divided wiring/stylus composite plates, an elastomer for absorbing a fluctuation of probe heights of the divided wiring/stylus composite plates and an upper cover and a lower cover for packing, by holding from the upper and lower sides, the test wafer via the wiring/stylus composite plates, guide frame, multilayer wiring substrate and elastomer.

(37) In the testing apparatus of the semiconductor integrated circuit device of item (36), there is comprised a burn-in substrate that is electrically connected to the multilayer wiring substrate to execute the burn-in test for the test wafer.

(38) In the testing apparatus of the semiconductor integrated circuit device of item (36), the guide frame, elastomer and upper and lower covers are positioned with a positioning mechanism.

(39) In the testing apparatus of the semiconductor integrated circuit device of item (36), the multilayer wiring substrate has a structure to lay many wirings and focuses the input signal.

(40) In the testing apparatus of the semiconductor integrated circuit device of item (36), the multiple wiring substrate is provided with a protection resistor and capacitor.

(41) In the testing apparatus of the semiconductor integrated circuit device of item (36), the upper cover and lower cover are provided with a vacuum or evacuation absorbing mechanism to equalize warp and wave of the test wafer.

(42) In the testing apparatus of the semiconductor integrated circuit device of stem (36), the upper cover and lower cover are provided with a temperature control mechanism for controlling the temperature condition of the test wafer.

(43) In the testing apparatus of the semiconductor integrated circuit device of item (37), the burn-in substrate is provided with an over-current cut-off circuit.

(43) A method of fabricating a semiconductor integrated circuit device comprising the steps of:
    preparing for a wiring/stylus composite plate that is provided with a plurality of test styluses and divided into a plurality of plates for a sheet of test wafer; and
    testing the electrical characteristics of each chip by integrating the divided wiring/stylus composite plates with a guide frame and bringing each probe of each wiring/stylus composite plate integrated with the guide frame into electrical contact with each testing pad of each chip of a sheet of test wafer.

(45) In the method of fabricating the semiconductor integrated circuit device of item (44), the step of testing the electrical characteristics is a burn-in test process.

(46) A method of fabricating a semiconductor integrated circuit device comprising the steps of:
    preparing for a wiring/stylus composite plate that is provided with a plurality of test styluses and divided into a plurality of plates for a sheet of test wafer with this dividing line deviated in position from the scribe line for each chip of the test wafer; and
    testing the electrical characteristics of each chip by integrating the divided wiring/stylus composite plates with a guide frame and bringing each probe of each wiring/stylus composite plate integrated with the guide frame into electrical contact with each testing pad of each chip of a sheet of test wafer.

(47) In the method of fabricating the semiconductor integrated circuit device of item (46), the step of testing the electrical characteristic is a burn-in test process.

(48) A method of fabricating a semiconductor integrated circuit device comprising the steps of:

preparing for a wiring/stylus composite plate that is provided with a plurality of test styluses and is divided into a plurality of plates for a sheet of test wafer; and testing the electrical characteristics of each chip by integrating the divided wiring/stylus composite plates with a guide frame and bringing each probe of each wiring/stylus composite plate integrated with the guide frame into electrical contact with each testing pad of each chip including a BIST circuit of a sheet of test wafer.

(49) In the method of fabricating the semiconductor integrated circuit device of item (48), the step of testing the electrical characteristic is a burn-in test process.

(50) A method of fabricating a semiconductor integrated circuit device comprising the steps of:

preparing for a wiring/stylus composite plate that is provided with a plurality of test styluses and is divided into a plurality of plates for a sheet of test wafer; and testing the electrical characteristics of each chip by integrating the divided wiring/stylus composite plates with a guide frame and bringing each probe of each wiring/stylus composite plate integrated with the guide frame into electrical contact with each testing pad of each chip of a sheet of test wafer under the vacuum or evacuated condition.

(51) In the method of fabricating the semiconductor integrated circuit device of item (50), the step of testing the electrical characteristic is a burn-in test process.

Therefore, the testing apparatus and the method of fabricating the semiconductor integrated circuit device provide the following effects.

(1) The wiring/stylus composite plate is produced by dividing it into a plurality of plates for a sheet of test wafer by providing a plurality of divided wiring/stylus composite plates and then forming a full wafer surface simultaneous contactor through integration of these divided wiring/stylus composite plates with one guide frame. Thereby, fabrication becomes much easier and the fabrication yield is enhanced. As a result, the fabrication cost can be reduced.

Moreover, since the divided wiring/stylus composite plates are free from the size of a test wafer, the existing facilities may be used also for a wafer of large size. Thereby, the fabrication cost of the contactor used by the full wafer surface simultaneous contactor system can be reduced.

In addition, the divided wiring/stylus composite plates can individually move when they are integrated with the guide frame. These plates can therefore independently equalize the warp and wave of the test wafer.

(2) Since the fabrication facilities of the LSI may be used and a fine processing accuracy, such as that of LSI fabrication, is not required, by forming the divided wiring/stylus composite plates with a material having a thermal expansion coefficient that is the same as that of the test wafer, the existing facilities for fabrication of the LSI may be used as the facilities for fabricating the wiring/stylus composite plate, and thereby the fabrication cost can be reduced.

Moreover, since the test wafer and silicon contactor exhibit a similar thermal expansion, even for the temperature condition of a burn-in process, sufficient probe alignment accuracy for the full surface of a wafer can be obtained.

(3) Since the guide frame also has a thermal expansion coefficient similar to that of the test wafer, by forming the guide frame with a material having a thermal expansion coefficient similar to that of the test wafer, the probe alignment to the full surface of the wafer can be controlled within an allowable range.

(4) The probe can be formed with a pyramidal shape corresponding to employment of a multi-pin structure or narrow-in structure by forming the probe of the divided wiring/stylus composite plates with a micro-machining technique, such as anisotropic etching or the like.

(5) The probe can be equally brought into contact with the test wafer with a predetermined pressure by deforming the surrounding portion of the probe of the divided wiring/stylus composite plates using a mechanical pressurizing system or a vacuum or evacuation pressurizing system.

(6) A large size guide frame for integrating the wiring/stylus composite plates can be attained, without relation to the trend to reduce the scribe area of the test wafer, by deviating the dividing area of the divided wiring/stylus composite plates from the scribe area of each chip of the test wafer.

Moreover, the scribe area tends to be reduced to improve the number of chips to be obtained from the test wafer, but such tendency can be covered without any problem.

In addition, since the size and cutting accuracy of the divided wiring/stylus composite plates is not restricted by the scribe area, the degree of freedom of design can be much improved.

(7) Since the wiring/stylus composite plate may be set to a certain size in response to the trend to reduce the size of a chip by providing the divided wiring/stylus composite plates depending on the unit of a plurality of chips of the test wafer, each wiring/stylus composite plate may be fabricated easily.

(8) Since a fault of a burn-in cassette in the fabrication process can be recovered easily, and, moreover, a fault during use in the mass-production line can also be repaired in a unit of each wiring/stylus composite plate by individually repairing the divided wiring/stylus composite plates, the fabrication cost and maintenance cost can also be reduced.

(9) Since each divided wiring/stylus composite plate has a positioning mark, assembling for integrating the wiring/stylus composite plates with the guide frame can be done easily.

(10) Since each chip of the test wafer has a BIST circuit, a test pattern can be generated within each chip. Thereby, the number of test pads of each chip can be reduced and allocation of test pads can be optimized.

Moreover, since the number of probes of the divided wiring/stylus composite plates can be minimized, allocation of probes can also be optimized.

(11) Since the test pads can be allocated by keeping a certain interval for the narrow pitch structure by holding the test pads on each chip with the other pads and allocating these test pads in isolation in the peripheral area, the influence on the fabrication of wiring/stylus composite plate can also be minimized.

(12) The wafer full surface simultaneous contact system based on use of a divided contactor integration type device can be structured as a cassette structure by pressing the test wafer with upper and lower covers from the upper and lower directions via the divided wiring/stylus composite plates, guide frame, multilayer wiring substrate and elastomer.

(13) The burn-in substrate can be connected easily to the cassette structure testing apparatus by comprising a burn-in substrate connected to the multilayer wiring substrate.

(14) Since the guide frame, elastomer, and upper and lower covers can be positioned easily by using a positioning mechanism for these elements, the cassette structure testing apparatus can be assembled easily.

(15) Since the input/output signals between the wiring/stylus composite plate and burn-in substrate can be inputted or outputted together, because the multilayer wiring substrate has a structure which is able to lay many wirings and gather the input signals, the number of signal lines between the multilayer wiring substrate and burn-in substrate can be reduced, and a signal line may be laid easily.

(16) Malfunction due to variation of the power supply voltage and noise can be prevented by mounting a protection resistor and capacitor on the multilayer wiring substrate.

(17) The test wafer is attracted with the flat surface of the lower cover, and thereby warp and wave of the test wafer can be equalized by providing a vacuum or evacuation attracting mechanism for the upper and lower covers.

(18) Since the test wafer can be heated up to a predetermined temperature by providing a temperature control mechanism for the upper and lower covers, the temperature condition of the test wafer can be controlled.

(19) Since an over-current of each chip of the test wafer can be cut off by providing an over-current cut-off circuit for the burn-in substrate, damage and breakdown of the integrated circuit and wiring/stylus composite plate formed on each chip can be prevented by isolating a defective chip and controlling generation of latch-up.

DETAILED DESCRIPTION OF THE PREFERRED EMBODIMENTS

In the description of the preferred embodiments, the same and a similar explanation will not be repeated as a rule unless otherwise required.

Moreover, in the description of preferred embodiments, an explanation will be made through a plurality of sections or embodiments when explanation is required, but these sections or embodiments are always related, unless otherwise declared clearly, and one is to be considered a part of the other or in a relation of a total modification example or in a relation of a detail or complementary explanation.

In addition, when an explanation refers to a number of elements (including quantity, numerical value, amount and range) in the description of the referred embodiments, it is to be understood that the invention is not limited to the particular number or quantity, and may include a particular number of quantity or more or less, unless otherwise described particularly, and except for the case where the particular number is defined in principle.

Moreover, in the description of the preferred embodiments, the structural elements (including an element step or the like) are not always essential, unless otherwise described clearly or except for the case where the elements are considered as essential elements in principle.

In the same manner, when an explanation refers to a shape or positional relationship of the structural elements in the description of the preferred embodiments, those features similar to such shape or the like are substantially included, unless otherwise described clearly or except for the case where these are clearly denied in principle.

The preferred embodiments of the present invention will be explained in detail with reference to the accompanying drawings. The elements of like functions are designated with like reference numerals throughout the accompanying drawings and the same explanation is not repeated.

(1) A semiconductor integrated circuit device in this specification shall includes as devices not only those formed on a silicon wafer, but also those formed on another substrate, such as TFT liquid crystal, except for those clearly excepted.

(2) A wafer in this specification shall include an almost disc type or rectangular silicon single crystal wafer used for fabrication of a semiconductor integrated circuit device, SOI, those having a composite structure with another insulator and a glass substrate used for fabrication of a TFT.

(3) A wiring/stylus composite plate in this specification shall include those integrally forming the wiring layer and the test styluses having the tips connected to such layer with the wafer process, namely the patterning method combining lithography, CVD, sputter and etching, which is similar to the method used to process a silicon wafer in the fabrication of a semiconductor integrated circuit device and those integrating the printed wirings and styluses on a polyimide film and another sheet type insulation film.

(4) A test stylus or only a stylus in this specification shall include those having the tip of the traditional probe stylus, contact terminals like a stylus having the narrow tip and a bump electrode of the other shape or the like.

(5) The "number of chip regions to which the wiring/stylus composite plate corresponds" shall include those corresponding to the entire part thereof and those corresponding only to a part of the terminals.

Figure 1:
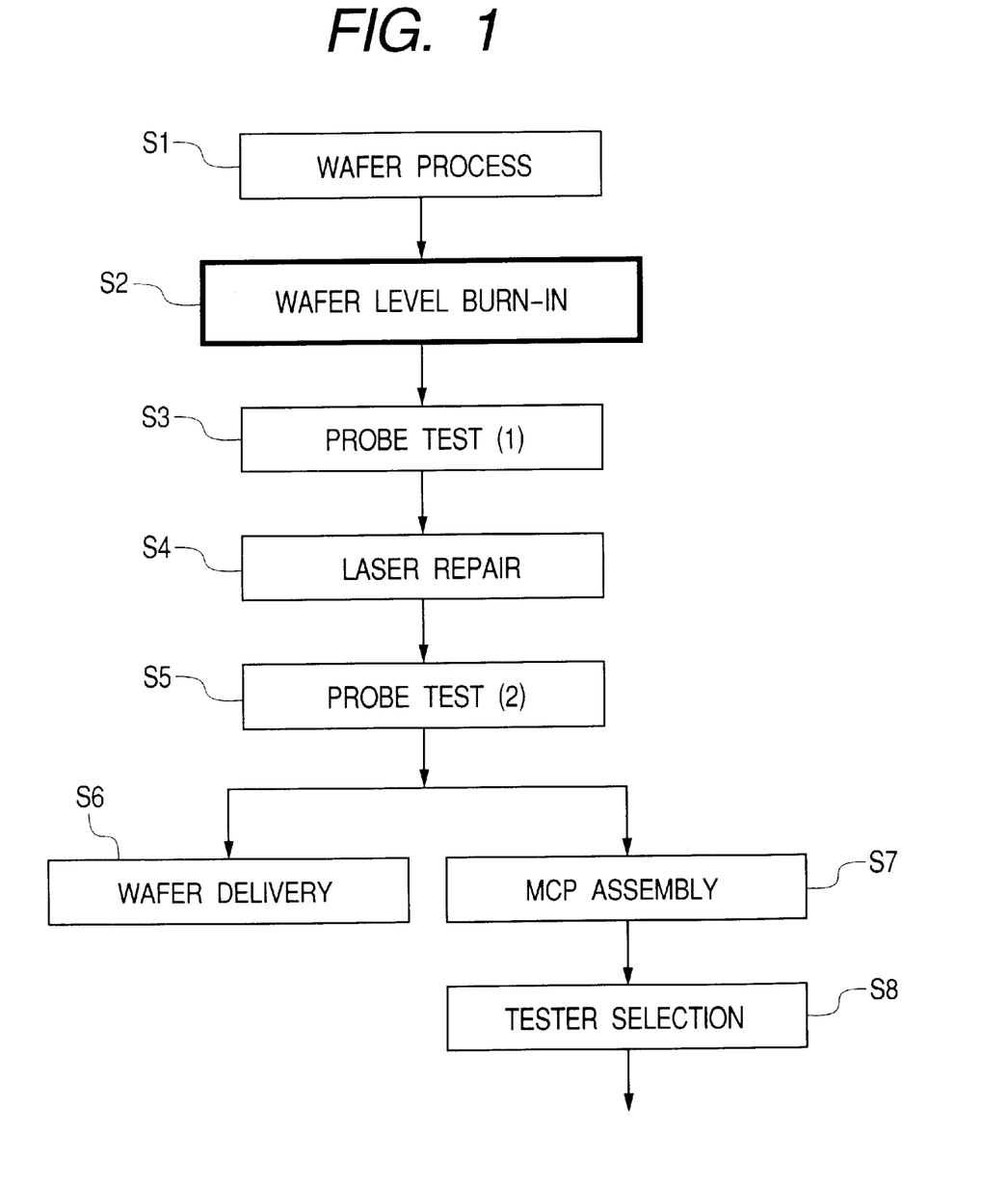
FIG. 1 is a flowchart of a method of fabricating a semiconductor integrated circuit device according to an embodiment of the present invention.

First, an example of the method of fabricating the semiconductor integrated circuit device of the preferred embodiments will be explained. FIG. 1 is a flowchart indicating a method of fabricating a semiconductor integrated circuit device. As this semiconductor integrated circuit device, an SRAM will be explained as an example, but the present invention can naturally be applied to a memory LSI, such as a DRAM and a flash memory, and a logic LSI or the like.

(1) In the preprocessing step (step S1), many elements are formed on a semiconductor wafer. That is, in this step, the desired integrated circuit is formed, based on the specifications of a SRAM, on a semiconductor wafer, for example, consisting of a silicon substrate, by repeating wafer processing steps such as oxidation, diffusion, impurity introduction, formation of wiring pattern, formation of insulation layer and formation of wiring layer or the like.

(2) In the wafer level burn-in step (step S2), the semiconductor wafer on which many elements are formed is placed in the burn-in test (thermal load test) apparatus. That is, in this step, a chip having the possibility of a future fault is subjected to screening by applying, in order to generate a current to in integrated circuit, the rated power supply voltage or the voltage exceeding the rating to the semiconductor wafer under a high temperature atmosphere (for example, 125 to 150° C.) with a view subjecting the integrated circuit to temperature and voltage stress. In this wafer level burn-in step, a testing apparatus in the form of a wafer full surface simultaneous contact system, based on use of a divided contactor integration type arrangement to be explained later, is used.

(3) In the first trial of the probe test step (step S3), the semiconductor wafer on which many elements are formed is probe-tested (continuity test). That is, in this step, a function test is carried out to confirm whether a predetermined function is attained or not by testing the memory function with a write and read operation to and from the SRAM using a predetermined test pattern. In addition, a DC test, such as an open/short test between an input and output terminals, leak current test and measurement of power supply current and the AC test for testing the AC timing of the memory control are conducted. Here, it is possible in the first probe test step and the second probe test step, that will be explained later, to use a testing apparatus of the wafer full surface simultaneous contact system, based on the divided contactor integration type, which will be explained later.

(4) In the laser relief step (step S4), a defective element that is determined in the probe test is irradiated with a laser beam for the purpose of relief. That is, in this step, a defective bit of the SRAM is found by analyzing the results of the probe test, and a fuse of the redundant relief bit corresponding to this defective bit is disconnected using a laser beam to conduct a repair through the redundant relief process.

(5) In the second probe test step (step S5), the semiconductor wafer is placed again in the probe test (continuity test) after the laser relief is completed. Namely, in this step, a test similar to the first probe test is conducted to check that the defective bit has been switched to the bit for redundant relief in the redundant relief process.

(6) In the wafer delivery step (step S6), good semiconductor wafers are delivered directly as acceptable products based on the results of the probe test after the laser relief. That is, in this step, the semiconductor wafer on which a plurality of chips of the SRAM are mounted is provided for the user under the condition of this semiconductor wafer.

(7) In the MCP assembly step (step S7), a good semiconductor wafer is diced to obtain discrete chips and these chips are combined to form a package structure. That is, in this step, the chips of an SRAM fabricated through respective steps and the chips, for example, of a flash memory fabricated after completion up to the dicing step from the pre-processing step are mounted to form a MCP. In practice, the die bonding step for mounting the SRAM chips and flash memory chips on the substrate, the wire bonding step for electrically connecting the pad of each chip and the pad on the substrate with wires, the resin mold step for molding each chip and wire portions with resin for protection thereof and the lead forming step for forming an external lead and processing the surface thereof are carried out. Here, a flip chip bonding step is also possible, in addition to the wire bonding step.

(8) In the tester selection step (step S8), the assembled MCP is selected with a tester. Namely, in this step, a test, for example, similar to the probe test of the semiconductor wafer, is conducted to select good/no-good product of this MCP. Thereby, only a good MCP is delivered as a product to the users.

Figure 2:
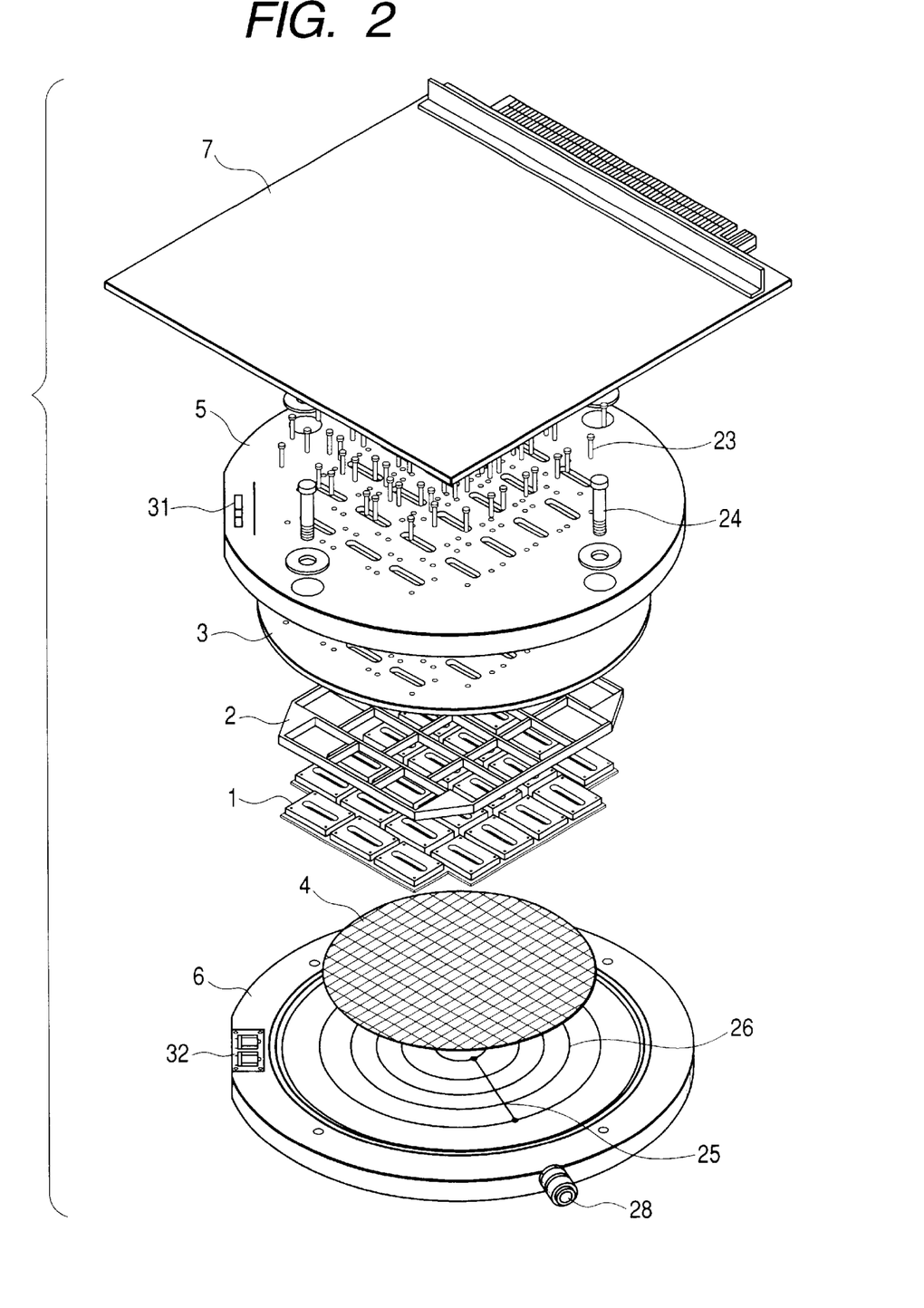
FIG. 2 is an exploded perspective view of a wafer level burn-in cassette of a mechanical pressurizing system in a testing apparatus to execute burn-in according to an embodiment of the present invention.
Figure 3:
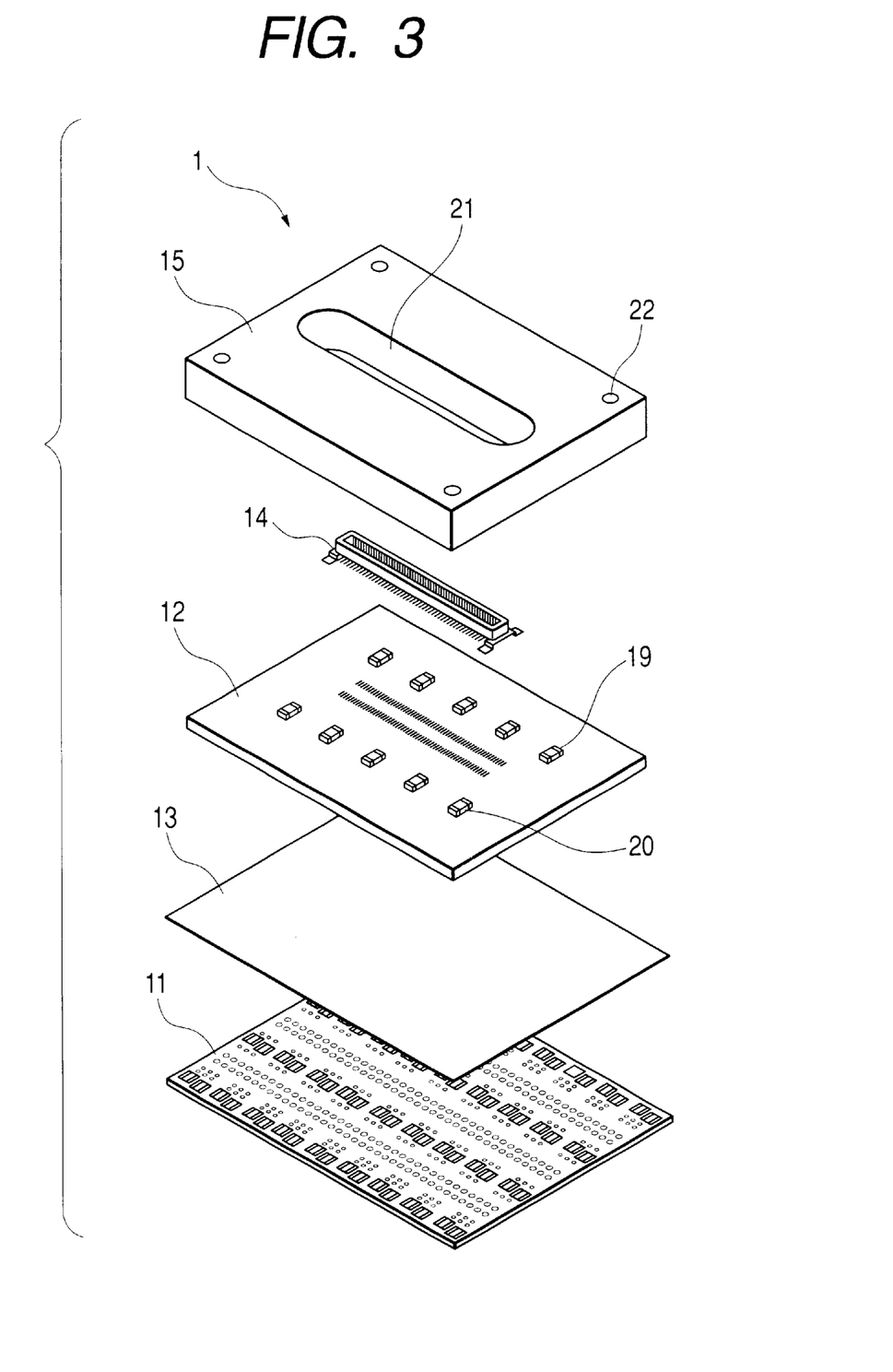
FIG. 3 is an exploded perspective view of a silicon contactor block in the testing apparatus to execute burn-in according to an embodiment of the present invention.
Figure 4A:
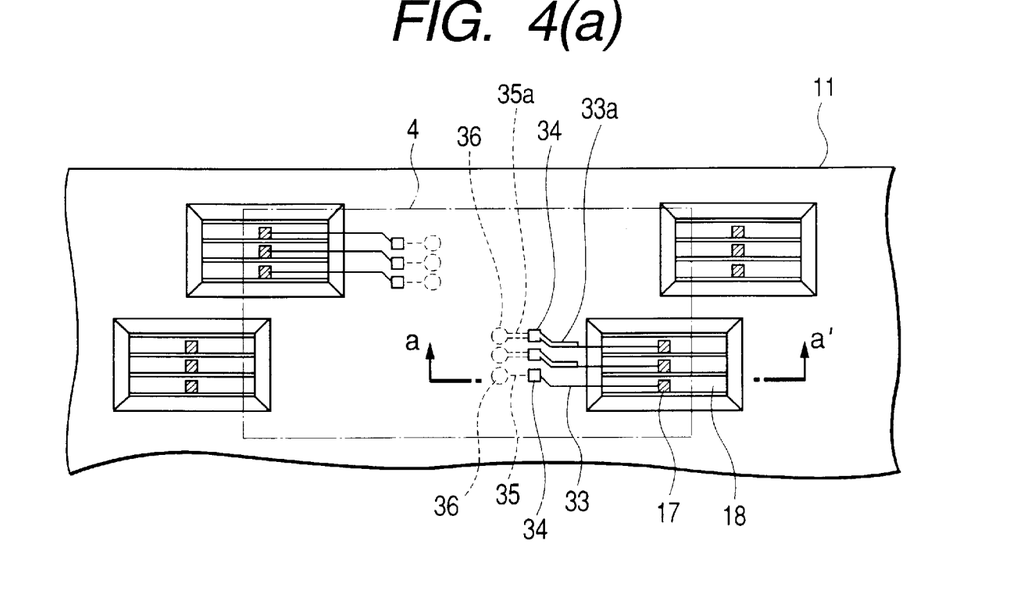
FIGS. 4(a), 4(b), 4(c) are a plan view and enlarged cross-sectional views of essential portion of the silicon contactor used in the testing apparatus to execute wafer level burn-in according to an embodiment of the present invention.
Figure 4B:
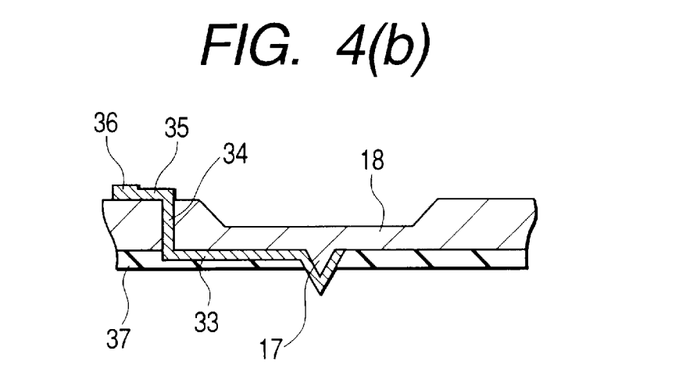
Figure 4C:
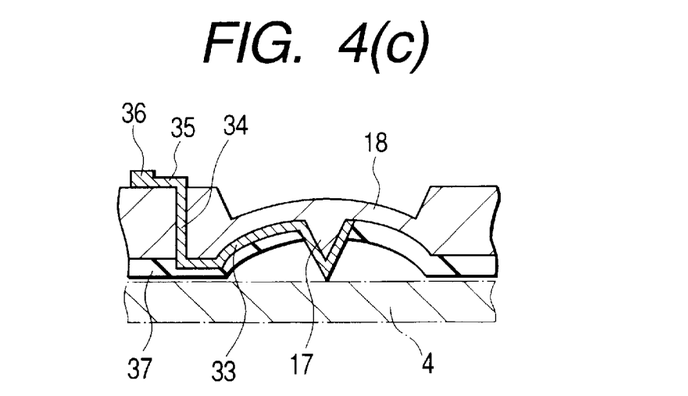
Figure 5:
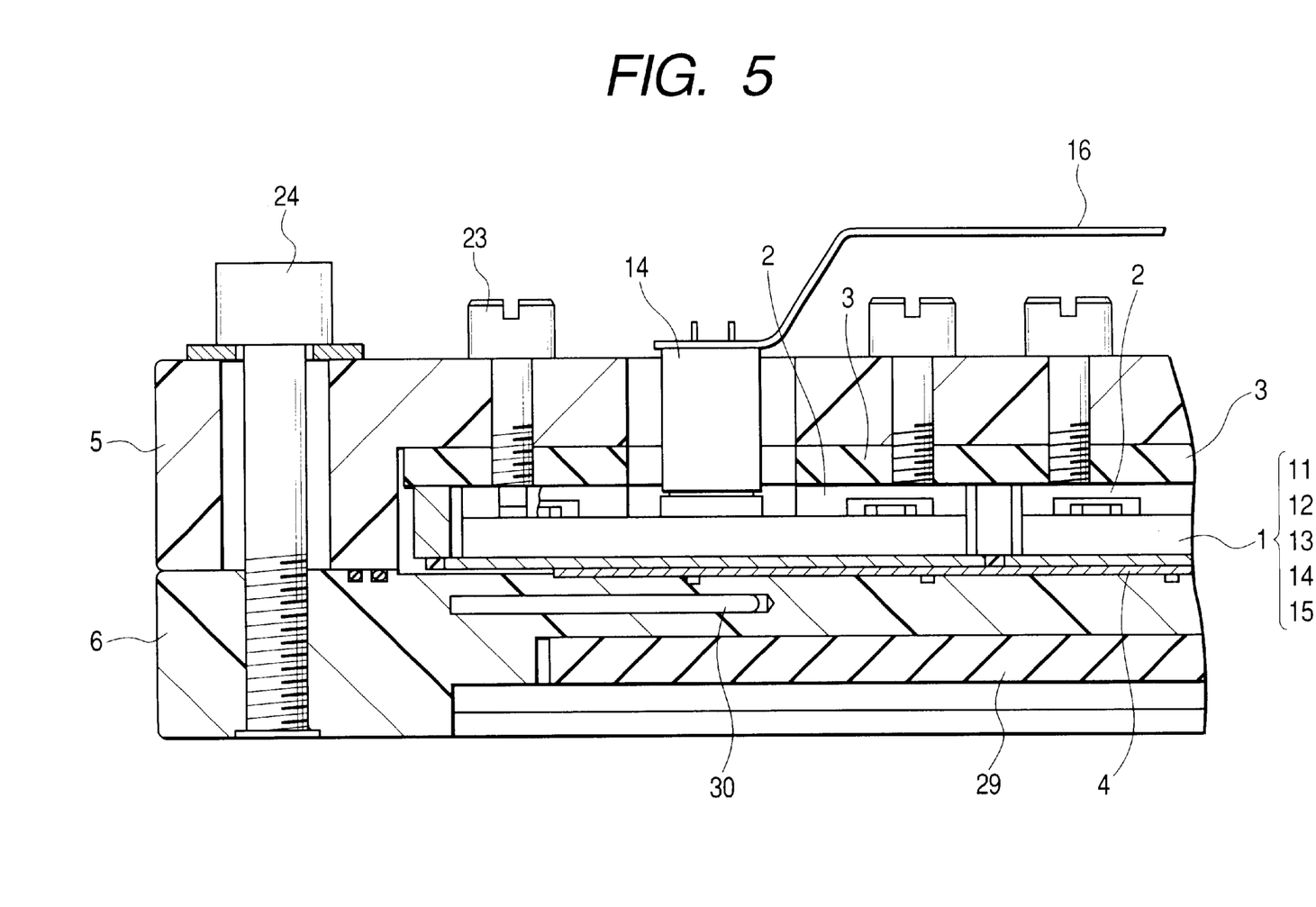
FIG. 5 is a cross-sectional view of the essential portion of the wafer level burn-in cassette in the testing apparatus to execute wafer level burn-in according to an embodiment of the present invention.
Figure 6:
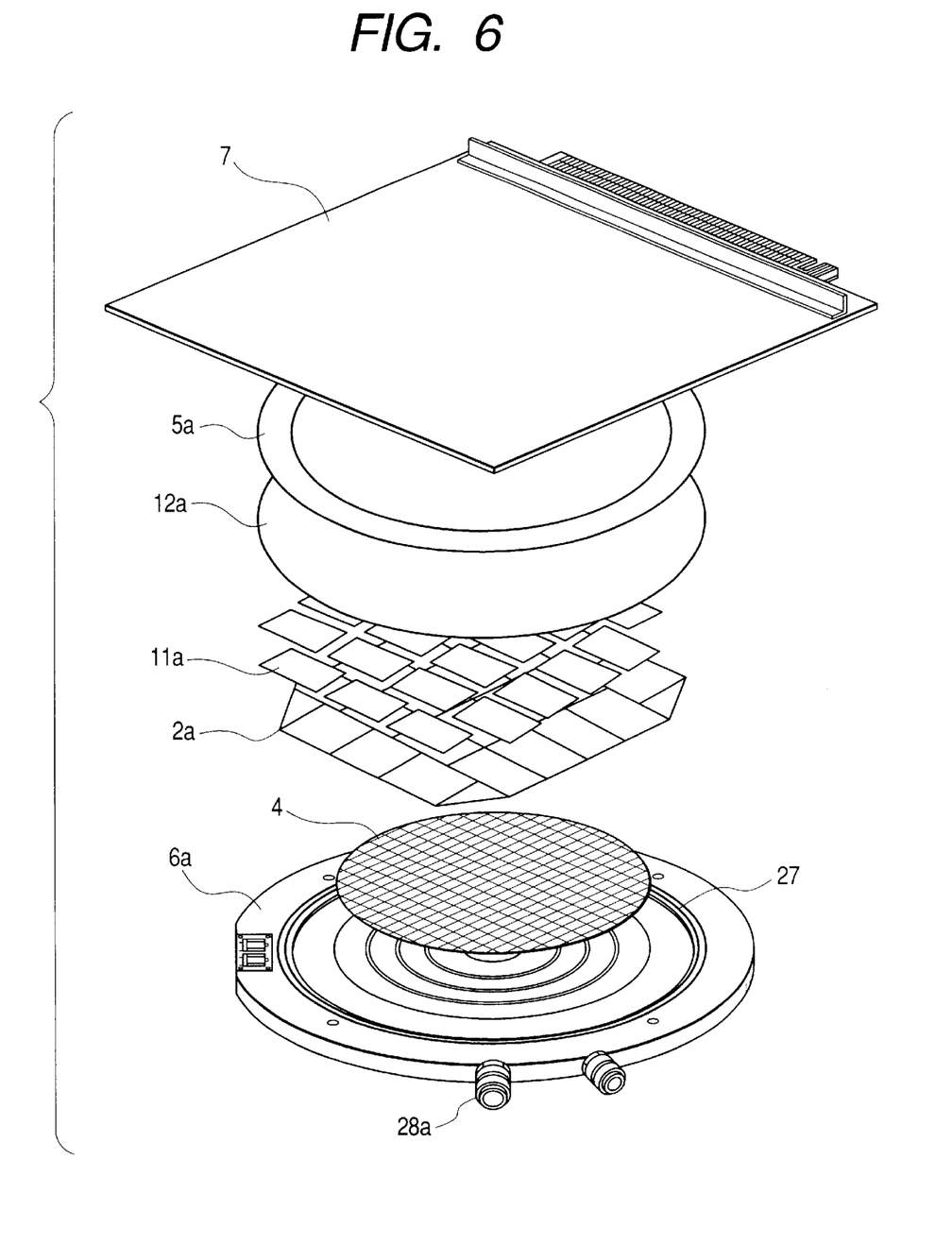
FIG. 6 is an exploded perspective view of the wafer level burn-in cassette of the vacuum pressurizing system in the testing apparatus to execute wafer level burn-in according to an embodiment of the present invention.

Next, an example of the testing apparatus which operates to conduct the wafer level burn-in explained above will be explained with reference to FIG. 2 to FIG. 6. FIG. 2 to FIG. 5 show the testing apparatus of the mechanical pressurizing system. FIG. 2 is an exploded perspective view showing the wafer level burn-in cassette of the mechanical pressurizing system of the testing apparatus. FIG. 3 is an exploded perspective view showing the silicon contactor block. FIG. 4(a) is a plan view showing the essential portion of the silicon contactor. FIG. 4(b) is a cross-sectional view taken along the line a–a' of FIG. 4(a). FIG. 4(c) is a cross-sectional view showing the deformation of the contactor of FIG. 4(b). FIG. 5 is a cross-sectional view showing the essential portion of the wafer level burn-in cassette. FIG. 6 is an exploded perspective view showing the wafer level burn-in cassette of the vacuum pressurizing system of the essential portion of the testing apparatus.

The testing apparatus of the mechanical pressurizing system for conducting the wafer level burn-in is composed of a plurality of divided silicon contactor blocks having a cassette structure, for example, as shown in FIG. 2, a guide frame 2 for integrating these silicon contactor blocks 1, an elastomer 3 for absorbing height fluctuation of a probe of the silicon contactor block 1, and upper and lower covers 5, 6 for enclosing the test wafer 4 from the upper and lower directions. On the upper part of this wafer level burn-in cassette, a burn-in substrate 7, that is electrically connected to the multilayer wiring substrate of the silicon contactor block 1, is provided for burn-in test of the test wafer 4.

Since this wafer level burn-in cassette introduces the use of a divided contactor integration type system, repair can be executed for every divided silicon contactor block 1 to thereby realize a reduction in cost. For instance, one silicon contactor block 1 realizes the number of blocks=6 pins×36= 216 pins (6 pins/chip) when the number of chips obtained is 36 (9 chips×4 columns).

In this wafer level burn-in cassette, 22 silicon contactor blocks 1, for example, are required for a sheet of test wafer 4 to cover the full surface of the wafer depending on the number of chips obtained of the test wafer 4.

Each silicon contactor block 1 is composed, for example, as shown in FIG. 3, of a silicon contactor (wiring/stylus composite plate) 11 provided with a plurality of test styluses, a ceramic substrate (multilayer wiring substrate) 12 electrically connected to the silicon contactor 11, an AFC (Anisotropic Conductive Film) 13 for bonding the silicon contactor 11 to ceramic substrate 12, a connector 14 for electrically connecting the ceramic substrate 12 to the burn-in substrate 7, and a cover 15 covering these elements from the upper part. The connector 14 is connected with an FPC (Flexible Printed Circuit) cable 16 (FIG. 5) for electrical connection to the burn-in substrate 7.

The silicon contactor 11 of each silicon contactor block 1 is provided as a member for contact with a plurality of chips of the test wafer 4 and is formed, for example, of a material having a thermal expansion coefficient identical to that of the test wafer 4. At the surface of this silicon contactor 11 (lower side in FIG. 3), a probe (test stylus) 17 and a plurality of (for example, number of probes of 216 pins corresponding to 36 chips) probe sections (test stylus sections) consisting of the beam 18 supporting this probe 17 are provided, as shown in FIG. 4(a). Each probe 17 is formed in a projected shape to be set in contact electrically with the test pad of each chip of the test wafer 4 and is also formed to have a pyramidal shape with a micro-machining technique, such as anisotropic etching. Moreover, the beam 18 portion in the periphery of the probe 17 may be deformed by the pressure of the mechanical pressurizing system, for example, as shown in FIG. 4(c), from the condition of FIG. 4(b). In this deformed condition, the probe 17 is placed equally in contact with the test pad of each chip of the test wafer 4 with a predetermined pressure.

On both the front surface and the rear surface of the silicon contactor 11, a wiring layer consisting of a combination of Au, Cu, Ni, Rh and Pd obtained through plating is formed, and the wiring patterns of the wiring layers at the front and rear surfaces are electrically connected via a through hole. For example, as shown in FIGS. 4(a) and 4(b), the projected portion of probe 11 of the silicon contactor 11 is electrically connected to the pad 36 via the wiring patterns 33, 33a of the wiring layer at the front surface, through hole 34 provided through the rear surface from the front surface and the wiring patterns 35, 35a of the wiring layer at the rear surface. The front surface of this silicon contactor 11 is covered with an insulation film 37 such that the projected portion of the probe 17 is exposed. Here, the wiring patterns 33, 33a, 35, 35a of the front and rear surfaces are laid, for example, as shown in FIG. 4(a) so that the wiring patterns 33a, 35a of the power supply and ground line are formed to be thick in width in comparison with the wiring patterns 33, 35 of the signal line. Moreover, as shown in FIG. 4(b), in the wiring patterns 33(33a), 35(35a) of the front and rear surfaces, the projected portion of probe 17 is formed by the thinner plating, while the other portion is formed by the thicker plating to reduce the resistance value.

The ceramic substrate 12 is a substrate member having a multilayer wiring structure consisting of the ceramic base material having a structure in which many wirings are laid corresponding to a plurality of chips (for example, 32 chips) of one silicon contactor 1, and the input signals from a plurality of chips can be (for example, 1/10). Moreover, as shown in FIG. 3, a chip resistor 19 and a chip capacitor 20 for protection from variation of power supply and noise are mounted on the surface of ceramic substrate 12 (upper side in FIG. 3), and a connector 14 can also be mounted thereon additionally. This ceramic substrate 12 is electrically connected to the pad on the rear surface via the wiring pattern and through hole from a land (not shown) on which a chip resistor 19, a chip capacitor 20 and a connector 14 or the like are mounted. The pad at the rear surface of this ceramic substrate 12 is electrically connected to the pad 36 of the silicon contactor 11 via the ACF 13 bonded on the rear surface of the ceramic substrate 12, and, thereby, the electrical connection is made to the burn-in substrate 7 from the probe 17 of the silicon contactor 11 via the ceramic substrate 12, connector 14 and FPC cable 16.

The cover 15 is a member covering the silicon contactor block 1 for purposes of reinforcement when it is bonded on the ceramic substrate 12. In this cover 15, a through hole 21 to accommodate the FPC cable 16 connected to the connector 14 of the ceramic substrate 12 is formed as shown in FIG. 3, and, moreover, an escaping space (not shown) of the chip resistor 19 and chip capacitor 20 is also formed therein. In addition, the cover 15 is also provided with a threaded hole 22, and, thereby, a positioning is performed using a hanging screw (positioning mechanism) 23 that is engaged with the threaded hole 22 of the cover 15 from the upper part of the upper cover 5 via the elastomer 3, under the condition that this cover 15 and ceramic substrate 12, ACF 13 and silicon contactor 11 are bonded for integration.

The guide frame 2 of the wafer level burn-in cassette is a member used for integrating the divided silicon contactor blocks 1 and fixing the position thereof in the horizontal direction, and it is formed of a material, for example, 42 alloy or nickel alloy, having a thermal expansion coefficient similar to that of the test wafer 4. As shown in FIG. 2, for example, each divided silicon contactor block 1 is positioned within a respective one of a plurality of sub-frames into which the guide frame 2 is partitioned, and these blocks 1 are accommodated in the sub-frames so as to independently move in upper and lower directions. Thereby, the wafer full surface simultaneous contact system based on divided contactor integration may be realized.

The elastomer 3 is a member for absorbing fluctuation of the height of the probes of the silicon contactor block 1 and is formed of a polymer material, such as silicon rubber. With this elastomer 3, the silicon contactor block 1 integrated with the guide frame 2 can independently move, and, therefore, fluctuation of the height of the probe 17 of each silicon contactor 11 may be absorbed.

The upper cover 5 and lower cover 6 are members used for enclosing the wafer level burn-in cassette from the upper and lower directions and are formed, for example, of SUS or aluminum. As shown in FIG. 2, for example, the upper cover 5 and lower cover 6 hold the test wafer 4, and the upper cover 5 bears down on the upper part of the test wafer 4 from the upper direction via the silicon contactor block 1 integrated to the guide frame 2 and the elastomer 3. The upper cover 5 and lower cover 6 may be positioned with a fixing screw (positioning mechanism) 24 that is inserted from the upper part of the upper cover 5 and is engaged with the lower cover 6. Moreover, the internal side surface of the lower cover 6 is flat and is provided with a vacuum absorbing mechanism, consisting of a vacuum holding hole 25, a vacuum holding groove 26 and a micro-coupler 28, for absorbing warp and wave of the test wafer 4 for equalizing these factors, and a temperature control mechanism, consisting of a surface heater 29 to control the temperature, a temperature sensor 30, a contact 31 and a connector 32 or the like.

The burn-in substrate 7 is connected to each ceramic substrate 12 of the silicon contactor block 1 and is also connected to the burn-in apparatus not shown. In the burn-in test, a test control signal is supplied from the burn-in apparatus, and the test is conducted by obtaining a test result signal. Moreover, the burn-in substrate 7 is provided with an over-current cut-off circuit (not illustrated) to cut off an over-current of each chip of the test wafer 4 and control disconnection of a defective chip and generation of latch-up.

In conducting the wafer level burn-in using the testing apparatus of the mechanical pressurizing system as explained above, each silicon contactor block 1 which individually moves is mechanically pressurized under the condition that the silicon contactor block 1, elastomer 3 and test wafer 4 integrated to the guide frame 2 are pressed between the upper cover 5 and lower cover 6 of the wafer level burn-in cassette, and each probe 17 of this silicon contactor 11 is placed in contact with the test pad of each chip of the test wafer 4 with a predetermined pressure. Thereafter, the screening of chips having possibility of a fault to be generated in the future can be realized by supplying a test control signal of the wafer level burn-in to each chip of the test wafer 4 from the burn-in apparatus via the burn-in substrate 7 and each ceramic substrate 12, and then obtaining a test result signal from each chip of the test wafer 4 with the burn-in apparatus via the ceramic substrate 12 and burn-in substrate 7.

In this case, in the wafer level burn-in cassette, the test wafer 4 is pressed against the lower cover 6 for elimination of warp and wave by the vacuum absorbing mechanism consisting of a vacuum holding hole 25, a vacuum holding groove 26 and micro-coupler 28. Thereafter, the wafer 4 is packed through mechanical pressurization; and, moreover, with connection of the contact 31 provided on the upper cover 5 and the connector 32 provided on the lower cover 6, the temperature control mechanism consisting of the surface heater 29 and temperature sensor 30 operates to control the temperature condition of the test wafer 4. In addition, a sufficient alignment accuracy between each probe 17 of the silicon contactor 11 and each test pad of each chip of the test wafer 4 can also be obtained because the test wafer 4 and silicon contactor 11 exhibit a similar thermal expansion coefficient, and the guide frame 2 also exhibits a thermal expansion coefficient similar to that of the test wafer 4, even for the high temperature condition which occurs during the wafer level burn-in process.

Moreover, the testing apparatus of the vacuum pressurizing system need not employ a block structure for the silicon contactor, unlike the above-described testing apparatus, but may have the structure shown, for example, in FIG. 6. In other words, the testing apparatus of the vacuum pressurizing system may be structured to have a plurality of divided silicon contactors 11a, a guide frame 2a for integrating these silicon contactors 11a, an FPC multilayer substrate 12a having an electrode projected portion electrically connected to the silicon contactor 11a integrated to the guide frame 2a and an upper cover 5a and a lower cover 6a for enclosing these elements in an atmospheric condition by holding the test wafer 4 via the silicon contactor 11a integrated to the FPC multilayer substrate 12a and guide frame 2a and then conducting evacuation from the micro-coupler 28a. In this vacuum pressurizing system, a vacuum hermetic packing 27 is provided between the upper cover 5a and lower cover 6a. Even with this structure, the silicon contactor 11a and guide frame 2a have functions similar to that of the mechanical pressurizing system, and, moreover, the FPC multilayer substrate 12a has a function similar to that of the ceramic substrate 12.

Also, when conducting the wafer level burn-in process using the testing apparatus of the vacuum pressurizing system, the screening can be conducted for chips having the possibility for generating a fault in the future, in a similar manner to that of the mechanical pressurizing system, by pressurizing each silicon contactor 11a, which moves individually with the atmospheric pressure to equally place each probe 17 of this silicon contactor 11a in contact with each test pad of each chip of the test wafer 4 with a predetermined pressure, and by obtaining a test result signal for the supply of the test control signal under the condition that the silicon contactor blocks 11a integrated with the guide frame 2a, FPC multilayer substrate 12a and test wafer 4 are packed between the upper cover 5a and lower cover 6a of the wafer level burn-in cassette.

Figure 7:
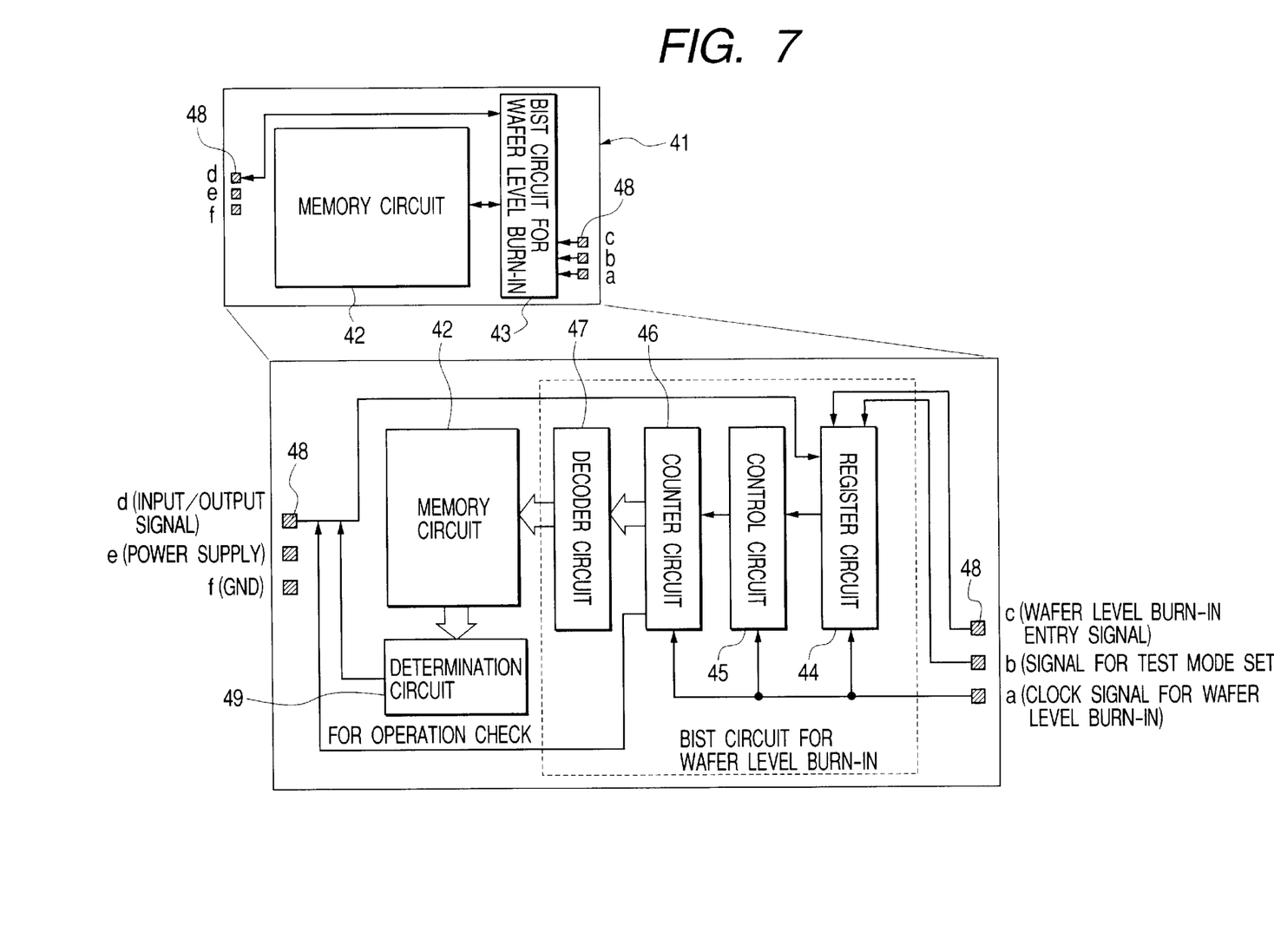
FIG. 7 is a schematic block diagram indicating a chip of the test wafer in wafer level burn-in according to an embodiment of the present invention.
Figure 8:
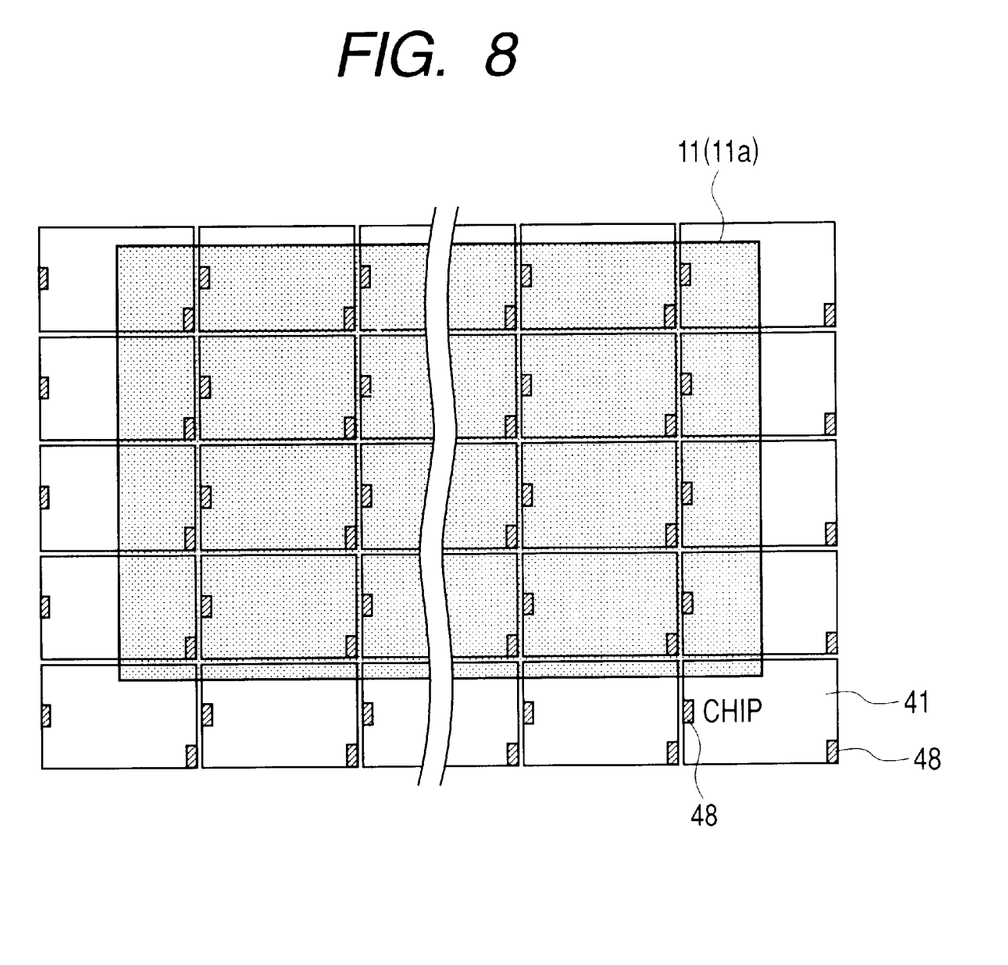
FIG. 8 is a diagram of a silicon contactor used in wafer level burn-in according to an embodiment of the present invention.
Figure 9:
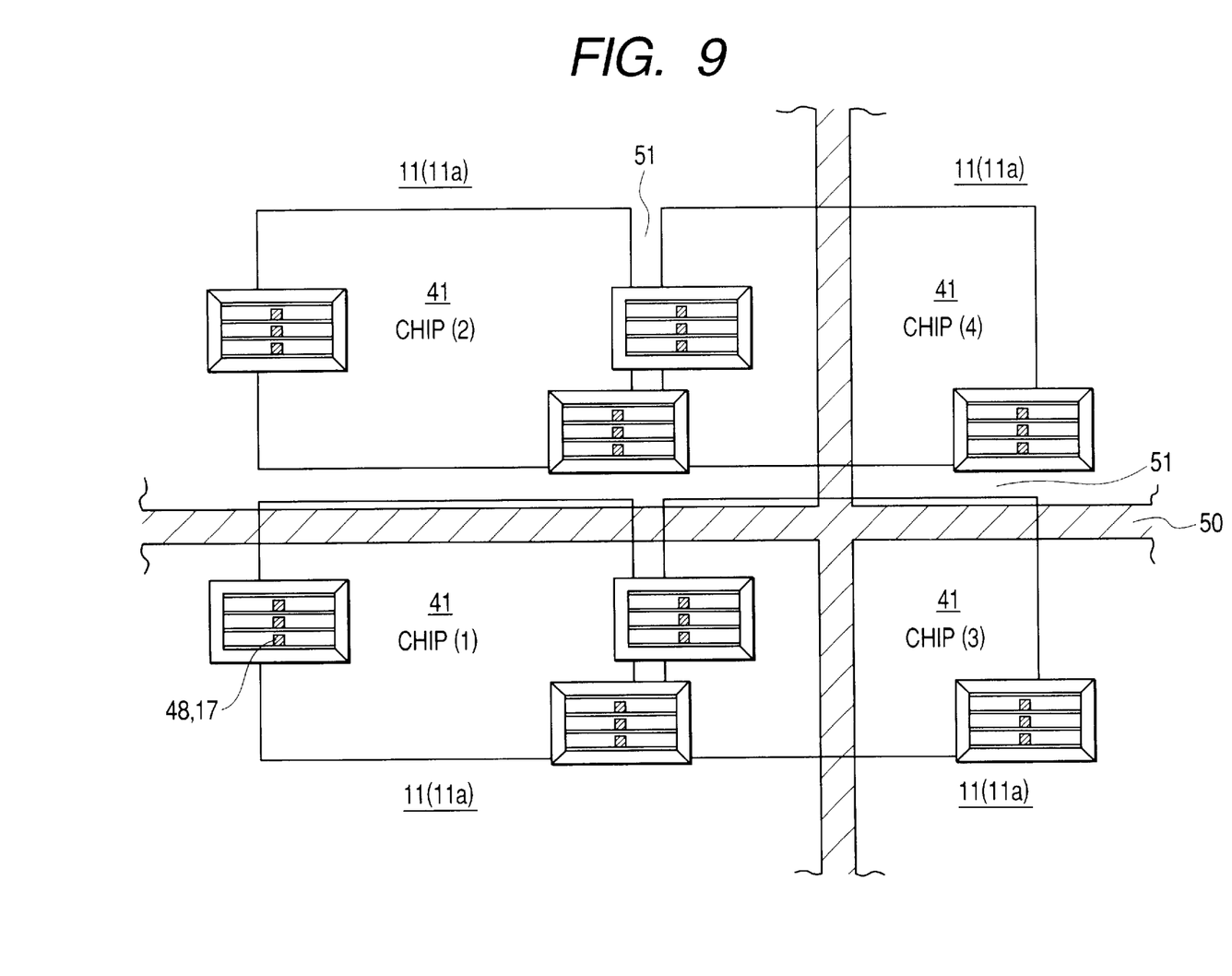
FIG. 9 is a diagram indicating the relationship between silicon contactor and a chip in wafer level burn-in according to an embodiment of the present invention.

Next, the wafer level burn-in process based on the wafer full surface simultaneous contact system of the divided contactor integration type will be explained in detail with reference to FIG. 7 to FIG. 9. FIG. 7 is a schematic block diagram showing a chip of the test wafer. FIG. 8 is a diagram showing a silicon contactor. FIG. 9 is a diagram showing the relationship between a silicon contactor and a chip.

Each chip 41 of the test wafer 4 has, as shown in FIG. 7, a memory circuit 42 and a BIST (Built-in Self Test) circuit 43 for the wafer level burn-in process. This BIST circuit 43 is provided with a register circuit 44, a control circuit 45, a counter circuit 46 and a decoder circuit 47. As the test pad 48 of this BIST circuit 43, six pins are provided for a wafer level burn-in clock signal, a test mode set signal, a wafer level burn-in entry signal, an input/output signal, the power supply and the ground, respectively. The test pad 48 of these six pins is isolated into a side or two sides (one side is preferable) in the periphery of chip 41 and a certain interval is provided actually for allocation for the other pad.

In this BIST circuit 43 for wafer level burn-in, the register circuit 44, control circuit 45 and counter circuit 46 operate in synchronization with the clock signal for wafer level burn-in. The wafer level burn-in test starts with an input of the test mode set signal and wafer level burn-in entry signal, and the burn-in test of the memory circuit 42 is executed by decoding the test pattern using the decoder circuit 47 during an incrementing of the address using the counter circuit 46 based on control provided by the control circuit 45 using the test data inputted to the register circuit 44 as an input signal. As a result of the burn-in test, a good/no-good discrimination signal of the memory circuit 42 is outputted as the output signal via a discrimination circuit 49. Moreover, as the output signal, a carry signal of the counter circuit 46 is outputted as the signal for confirming completion of the burn-in test.

Moreover, each silicon contactor 11 (including 11a) is formed in a size having a probe of 216 pins corresponding to 36 chips 41, because one silicon contactor 11 corresponds to a unit of a plurality of chips of the test wafer 4. That is, the number of probes=6 pins×36 chips=216 pins (6 pins/chip is realized for the number of chips=9 chips×4 columns=36 by comprising the BIST circuit 43 for wafer level burn-in. The twenty-two silicon contactors 11, for example, correspond to a sheet of test wafer 4 depending on the number of chips obtained on the test wafer 4.

In regard to the relationship between this silicon contactor 11 (including 11a) and the chip 41, the position of the divided area 50 of the silicon contactor 11 is deviated from the scribe area 51 of each chip, for example, as shown in FIG. 9. That is, the edge position of silicon contactor 11 is deviated from the edge position of chip 41, so that the edge of silicon contactor 11 is positioned almost on the center line of the chip 41, as seen in the vertical direction in FIG. 9, and the edge of silicon contactor 11 is positioned between the test pad 48 of chip 41 and the edge, in the horizontal direction.

In the relationship between the silicon contactor 11 (including 11a) and chip 41, as explained above, each probe 17 of a sheet of silicon contactor 11 is placed electrically in contact with the test pad 48 of each chip 41 in a unit of a plurality of chips, to thereby supply, to each chip 41, the clock signal for wafer level burn-in, the test mode set signal, the wafer level burn-in entry signal and the test data as the control signal in order to obtain the good/no-good discrimination signal as the test result signal. Thereby, whether a chip has the possibility of a fault in the future or not can be discriminated.

Therefore, according to this embodiment, the following effects may be attained by employing the structure of the testing apparatus for wafer level burn-in explained above and the wafer full surface simultaneous contact system of the divided contactor integration.

(1) The fabrication yield of the silicon contactors 11 (11a) divided into a plurality of contactors for a sheet of test wafer 4 can be remarkably improved in comparison with an integrated contactor. That is, in the ordinary wafer full surface simultaneous contact system, an electrical probe and pad are necessary. Therefore, it is difficult to produce an integrated contactor for wafer full surface contact, and so the fabrication yield is deteriorated, resulting in an increase of the fabrication cost. However, when such a contactor is divided into a plurality of smaller contactors, the fabrication becomes much easier, the fabrication yield rises and the fabrication cost becomes lower.

(2) An integrated contactor inevitably becomes larger than the test wafer 4 when the lead-out of wires is considered, and, therefore, the fabrication facilities must be increased in size with an increase in the diameter of the test wafer 4. On the other hand, since the divided silicon contactors 11 (11a) are never determined depending on the size of the test wafer 4, the fabrication cost of contactor can be lowered. In other words, as the test wafer 4 tends to increase, for example, up to 12 inches from 8 inches, the wafer full surface simultaneous contact system for wafers of 12 inches requires technical development including new facilities for the integrated contactor, but it can also utilize the already developed facilities for wafers of 8 inches or less for the divided contact system.

(3) When the silicon contactor 11(11a) is used as the wafer full surface simultaneous contact system, it is out of the thinking to use the latest facility of LSI as the fabrication facilities of silicon contactor 11 (11a); and, moreover, since the old facility still has sufficient process accuracy of the silicon contactor 11 (11a), the divided contactor integration type system of this embodiment is essential. That is, the silicon contactor 11 (11a) only requires the processing accuracy, for example, of about ±2 to ±5 μm, but does not require a scale-down processing accuracy required for fabrication of the LSI. However, on the occasion of fabrication of the integrated wafer full surface simultaneous contactor considering the test wafer 4, pre-processing facilities, such as similar diffusion and etching, are required. This requirement can be attained with introduction of the divided contactor integration type. Moreover, since the old facilities for fabrication of the LSI can also be utilized as the fabrication facilities for the silicon contactor 11 (11a), the fabrication cost can be lowered.

(4) Since a divided silicon contactor 11(11a) may be individually repaired, the fabrication cost and maintenance cost can be lowered. That is, since the divided contact type may be repaired, a fault of the burn-in cassette may be regenerated in the course of the fabrication; and, moreover, a repair in the mass-production line can also be conducted in a unit of the divided contactor.

(5) With introduction of the divided silicon contactor 11 (11a), a warp and wave in the test wafer 4 can easily be equalized. That is, when the divided silicon contactors 11 (11a) are integrated, they can operate individually, so that equalization of warp and wave of the test wafer 4 can be conducted independently.

(6) When the wafer full surface simultaneous contactor based on the divided silicon contactor 11 (11a) is used for wafer level burn-in, the silicon contactor 11(11a) is optimum for a thermal expansion coefficient at a high temperature. That is, since the test wafer 4 and silicon contactor 11(11a) exhibit a similar thermal expansion coefficient even for the temperature conditions of a burn-in test, sufficient alignment accuracy of the probe for the full surface of wafer can be obtained. Moreover, since the guide frame 2 also exhibits a thermal expansion coefficient similar to that of the test wafer 4, the positioning accuracy may be controlled within an allowable range.

(7) The guide frame 2 for the divided silicon contactor 11(11a) may be set to be larger in size without relation to reduction in the size of the scribe area 51 of the test wafer 4. That is, the divided contact system requires the guide frame 2 for integration, but a guide frame 2 of larger size can be attained without any limitation on the size of the scribe area 51. Moreover, although the scribe area 51 tends to be reduced in size in order to increase the number of chips to be obtained from the test wafer 4, this requirement can also be achieved. In addition, the degree of freedom for design, such as the size and accuracy of the divided silicon contactor 11(11a), can be set to be large without any limitation on the scribe area 51.

(8) Since each chip 41 of the test wafer 4 is provided with the BIST circuit 43 for wafer level burn-in, the number of test pads 48 can be reduced and allocation of the test pads 48 can be optimized. Namely, since a test pattern is generated inside of each chip 41, the number of input/output pads from the external side can be minimized, and, thereby, the number of probes 17 of silicon contactor 11 (11a) can also be minimized.

The present invention has been explained practically based on preferred embodiments thereof, but the present invention is not limited only to the preferred embodiment explained above, but allows various changes and modifications within the scope of the appended claims.

For example, the silicon contactor is used as a wafer full surface simultaneous contact system based on the divided contactor integration concept in the preferred embodiment, but it is also possible to use a silicon membrane sheet in place of the silicon contactor depending on the field of application. Moreover, when the probe of the silicon contactor is placed in contact with the test wafer with a predetermined pressure, it is possible to place the probe of the silicon contactor in contact with the test wafer through pressurization not only using the vacuum pressurization method, but also with the evacuated pressurization method.

Moreover, the wafer level burn-in cassette structure is not limited only to the example explained above, and it is possible to use any structure including a silicon contactor that is divided into a plurality of contactors for at least a sheet of a test wafer. Moreover, the number of divisions of the silicon contactor for a sheet of the test wafer and the number of chips covered with only one silicon contactor may be changed to various values.

In the above explanation, the present invention has been applied to a wafer level burn-in test of a SRAM, which is the technical field belonging to the present invention, but the present invention is not limited only to such field and can also be applied to a memory LSI, such as a DRAM and flash memory, and a logic LSI or the like. In addition, the present invention can surely be applied widely to wafer delivery products, semiconductor products, such as MCP products, and a wafer level burn-in test or the like.

Moreover, the present invention can be applied not only to wafer level burn-in, but also to an ordinary burn-in test and probe test. In this case, an effect similar to that for the wafer level burn-in can also be achieved.

The effects obtained with the typical features of the invention disclosed in this specification will be explained briefly as follows.

Namely, the testing apparatus and the fabricating apparatus for producing a semiconductor integrated circuit device in accordance with the present invention can be applied to a burn-in test and probe test. Particularly, in wafer level burn-in, the fabrication cost can be lowered by employing a divided contactor integration type device by placing the divided contactor in contact uniformly with the full surface of a wafer, thereby enabling the repair of individual divided contactors and improving the fabrication yield of the divided contactors.

What is claimed is:

1. A semiconductor integrated circuit device fabrication method comprising:

performing an electrical test to a plurality of wafer surface regions over a major surface of a wafer, each of said plurality of wafer surface regions including a plurality of chip regions, using a plate holding structure integrally holding a plurality of wiring/stylus composite plates, each of said wiring/stylus composite plates including a first wiring film structure having a plurality of test stylus sections electrically connected thereto, each of the test stylus sections having a stylus tip portion contacting one of a plurality of terminals in one of the wafer surface regions in said performing the electrical test.

2. A semiconductor integrated circuit device fabrication method according to claim 1, wherein said electrical test is a wafer level burn-in test.

3. A semiconductor integrated circuit device fabrication method according to claim 1, wherein, prior to said performing the electrical test, a plurality of semiconductor elements are formed on said wafer.

4. A semiconductor integrated circuit device fabrication method according to claim 1, wherein said plurality of wiring/stylus composite plates are composite plates divided from each other and integrated together by an integrating structure.

5. A semiconductor integrated circuit device fabrication method according to claim 1, wherein each of said plurality of wiring/stylus composite plates contacts terminals of a plurality of said chip regions.

6. A semiconductor integrated circuit device fabrication method according to claim 1, wherein said wiring/stylus composite plates include a material having a thermal expansion coefficient the same as that of the wafer.

* * * * *